United States Patent
Nishimura et al.

(10) Patent No.: US 9,585,254 B2
(45) Date of Patent: Feb. 28, 2017

(54) ELECTRONIC DEVICE

(71) Applicant: ROHM CO., LTD., Kyoto-shi, Kyoto (JP)

(72) Inventors: Isamu Nishimura, Kyoto (JP); Hideaki Yanagida, Kyoto (JP); Michihiko Mifuji, Kyoto (JP); Yasuhiro Fuwa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/015,870

(22) Filed: Feb. 4, 2016

(65) Prior Publication Data

US 2016/0242292 A1    Aug. 18, 2016

(30) Foreign Application Priority Data

Feb. 16, 2015  (JP) ................................. 2015-027620

(51) Int. Cl.
| | | |
|---|---|---|
| *H05K 1/16* | (2006.01) | |
| *H05K 1/18* | (2006.01) | |
| *H05K 1/11* | (2006.01) | |

(52) U.S. Cl.
CPC ............. *H05K 1/183* (2013.01); *H05K 1/111* (2013.01)

(58) Field of Classification Search
CPC ................... H05K 1/183; H05K 1/111; H05K 2021/60022
See application file for complete search history.

(56) References Cited

U.S. PATENT DOCUMENTS

| | | | |
|---|---|---|---|
| 6,340,842 B1 * | 1/2002 | Nakamura ............ | H01L 23/057 257/678 |
| 6,396,143 B1 * | 5/2002 | Kimbara ............. | H01L 23/4334 257/667 |
| 8,415,811 B2 | 4/2013 | Fukumura et al. | |
| 2002/0011907 A1 * | 1/2002 | Yamada .............. | H01L 23/5385 333/204 |
| 2007/0187706 A1 * | 8/2007 | Higashi .................. | H01L 33/60 257/98 |
| 2008/0290491 A1 * | 11/2008 | Yamano ................ | H01L 25/105 257/686 |
| 2009/0101897 A1 * | 4/2009 | Murphy .................. | H01L 23/60 257/48 |

(Continued)

FOREIGN PATENT DOCUMENTS

JP          2012-99673 A      5/2012

*Primary Examiner* — Steven T Sawyer
(74) *Attorney, Agent, or Firm* — Hamre, Schumann, Mueller & Larson, P.C.

(57) ABSTRACT

An electronic device includes a semiconductor substrate, an electronic element mounted on the substrate, a conductive layer electrically connected to the electronic element, a sealing resin and a columnar conductor. The substrate has a recess formed in its obverse surface. The electronic element is mounted on the bottom surface of the recess. The conductive layer has an obverse-surface contacting region located on the obverse surface of the substrate. The sealing resin is disposed in at least a part of the recess for covering at least a part of the obverse surface of the substrate. The columnar conductor is electrically connected to the obverse-surface contacting region of the conductive layer and exposed from the sealing resin at a side opposite to the obverse surface of the substrate.

23 Claims, 6 Drawing Sheets

(56) References Cited

U.S. PATENT DOCUMENTS

2011/0049553 A1\* 3/2011 Park .................. H01L 33/60
 257/98
2013/0294471 A1\* 11/2013 Palaniswamy ........ H01L 33/486
 372/43.01

\* cited by examiner

ELECTRONIC DEVICE

BACKGROUND OF THE INVENTION

1. Field of the Invention

The present invention relates to electronic devices.

2. Description of Related Art

Various types of electronic devices have been proposed that perform specific functions in response to external input and output of electric current. To be able to carry out its function, a typical electronic device includes a plurality of electronic elements that constitute part of electronic circuits. Metal leads are used to provide structural support for the electronic elements and electrical connection between the electronic elements. The number, shape, and size of the leads are determined in accordance with the function, shape, and size of the electronic elements. The electronic elements mounted on the leads are encapsulated in a sealing resin. The sealing resin is provided to protect the electronic elements and part of the leads. To be ready for use, the electronic device is mounted on for example a circuit board of an electronic instrument. For such electronic devices, appropriate protection of the electronic elements is important. Documents related to conventional electronic devices include JP-A-2012-99673.

SUMMARY OF THE INVENTION

The present invention has been proposed in view of the above circumstances, and an object thereof is to provide an electronic device that allows for greater design flexibility in terms of overall size, without compromising protection of electronic elements incorporated.

According to an aspect of the present invention, there is provided an electronic device that includes: a substrate made of a semiconductor material and having a substrate obverse surface and a substrate reverse surface that are opposite to each other in a thickness direction of the substrate; an electronic element mounted on the substrate; a conductive layer electrically connected to the electronic element; a sealing resin; and a columnar conductor. The substrate is formed with an element-receiving recess recessed from the substrate obverse surface and having a recess bottom surface. The electronic element is mounted on the recess bottom surface. The conductive layer has an obverse-surface contacting region located on the substrate obverse surface. The sealing resin is disposed in at least a part of the element-receiving recess and also covers at least a part of the substrate obverse surface. The columnar conductor is electrically connected to the obverse-surface contacting region of the conductive layer and exposed from the sealing resin at a side opposite to the substrate obverse surface.

With the above arrangements, the sealing resin and columnar conductor can be made to protrude by a desired amount with respect to the obverse surface of the substrate. Hence, the overall size of the electronic device (in particular, the thickness) can be easily adjusted to meet various user's requests by altering the protrusion amount of the above-noted two members. While such an adjustment for the sealing resin and the columnar conductor is possible, it is not necessary to change, for example, the size of the element-receiving recess and/or the arrangement of the electronic element incorporated, which is very convenient for the manufacturer to produce the electronic devices required by the users.

Further features and advantages of the present invention will become apparent from the detailed description given below with reference to the accompanying drawings.

DESCRIPTION OF THE PREFERRED EMBODIMENTS

Hereinafter, preferred embodiments of the present invention will be specifically described with reference to the drawings.

Figure 1:
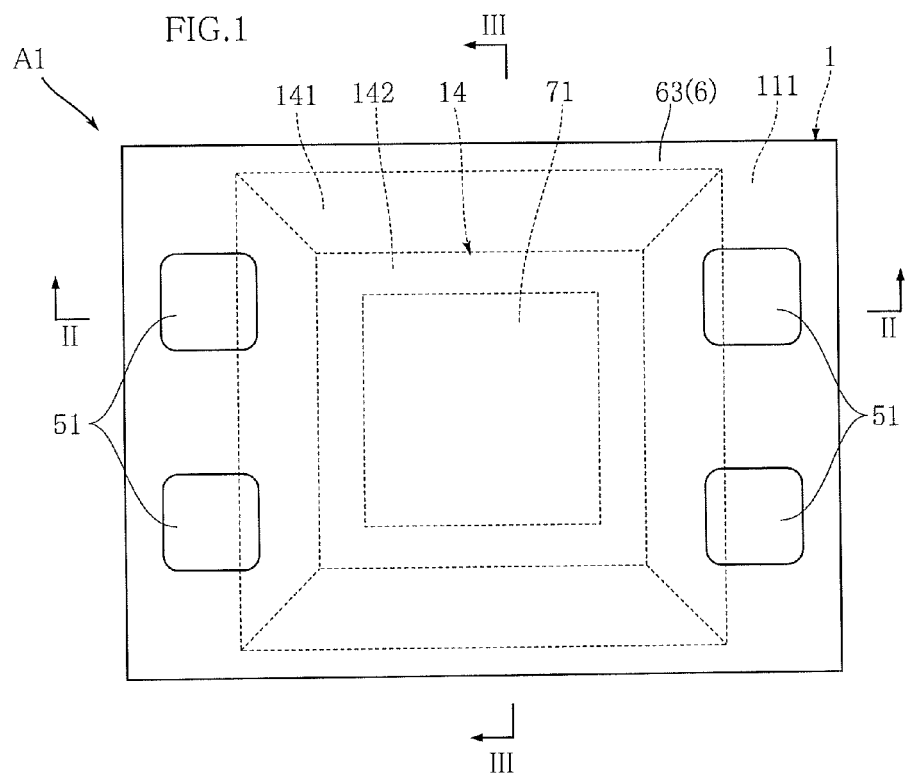
FIG. 1 is a plan view of an electronic device according to a first embodiment of the present invention.
Figure 2:
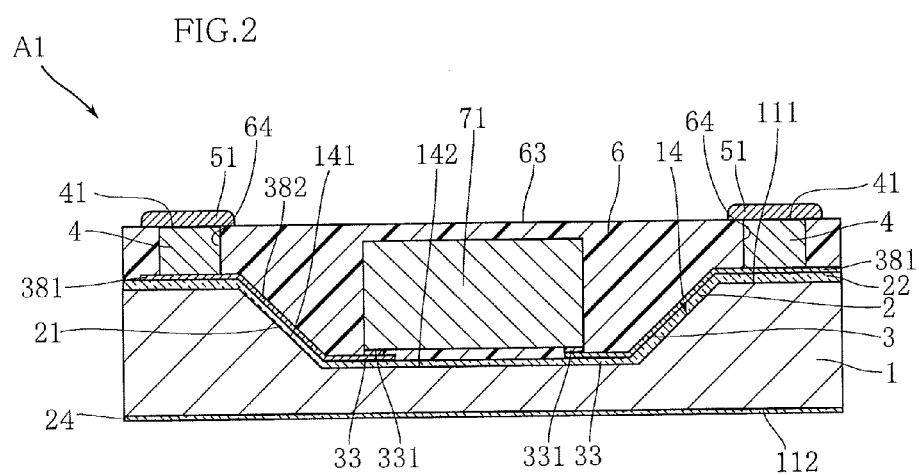
FIG. 2 is a cross-sectional view along line II-II in FIG. 1.
Figure 3:
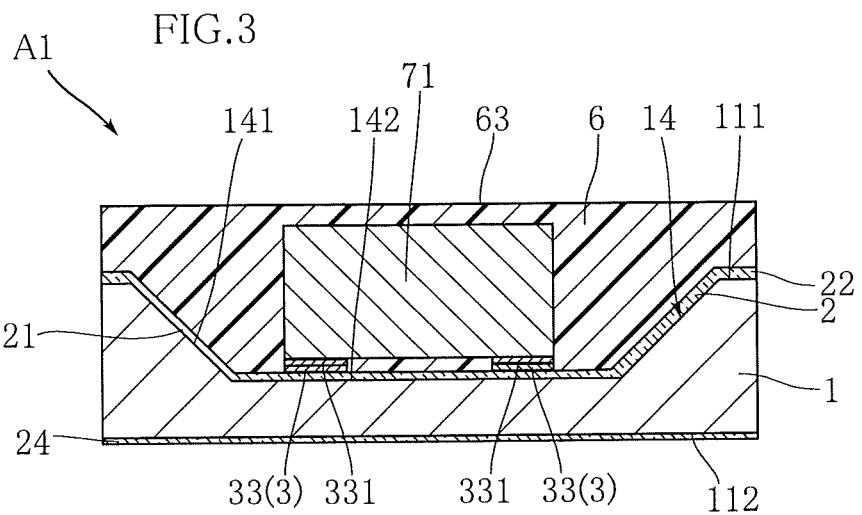
FIG. 3 is a cross-sectional view along line III-III in FIG. 1.

FIGS. 1 to 3 show an electronic device according to a first embodiment of the present invention. The electronic device A1 according to the present embodiment includes a substrate 1, an insulating layer 2, a conductive layer 3, a plurality of columnar conductors 4, a plurality of electrode pads 51, a sealing resin 6, and an electronic element 71. FIG. 1 is a plan view of the electronic device A1. FIG. 2 is a cross-sectional view along line II-II in FIG. 1. FIG. 3 is a cross-sectional view along line III-III in FIG. 1.

The substrate 1 is made of a single-crystal semiconductor material. In the present embodiment, the substrate 1 is made of single-crystal silicon (Si). However, the material of the substrate 1 is not limited to Si and may for example be silicon carbide (SiC). The substrate 1 has a thickness of about 200 to 550 µm, for example. The electronic element 71 is mounted on the substrate 1.

The substrate 1 has an obverse surface 111 and a reverse surface 112.

The obverse surface 111 faces one side in a direction of the thickness of the substrate 1 (hereinafter, simply the "thickness direction"). The obverse surface 111 is flat and perpendicular to the thickness direction. The obverse surface 111 is either a (100) surface or a (110) surface. In the present embodiment, the obverse surface 111 is a (100) surface. In the present embodiment, the obverse surface 111 has a shape of a rectangular ring.

The reverse surface 112 faces the opposite side in the thickness direction. In other words, the reverse surface 112 faces away from the obverse surface 111. The reverse surface 112 is flat and perpendicular to the thickness direction.

The substrate 1 has an element-receiving recess 14.

The element-receiving recess 14 is recessed from the obverse surface 111. The electronic element 71 is disposed within the element-receiving recess 14. The element-receiving recess 14 has a depth (a separation distance in the thickness direction between the obverse surface 111 and a recess bottom surface 142, which will be described later) of about 100 to 300 µm, for example. The element-receiving recess 14 is rectangular as seen in the thickness direction. This shape of the element-receiving recess 14 is determined by the obverse surface 111 being a (100) surface.

The element-receiving recess 14 has recess lateral surfaces 141 and the recess bottom surface 142.

The recess bottom surface 142 and the obverse surface 111 face the same side in the thickness direction. The recess bottom surface 142 is rectangular as seen in the thickness direction. The electronic element 71 is disposed on the recess bottom surface 142. The recess bottom surface 142 is perpendicular to the thickness direction.

The recess lateral surfaces 141 upstand from the recess bottom surface 142. The recess lateral surfaces 141 are continuous with the recess bottom surface 142. The recess lateral surfaces 141 are inclined relative to the thickness direction. Each recess lateral surface 141 forms an angle of 55° with a plane perpendicular to the thickness direction. This angle results from the obverse surface 111 being a (100) surface. The element-receiving recess 14 has four recess lateral surfaces 141 each of which is a flat surface. The recess lateral surfaces 141 are continuous with the obverse surface 111.

The insulating layer 2 is sandwiched between the conductive layer 3 and the substrate 1. The insulating layer 2 has a thickness of about 0.1 to 1.0 µm, for example. The insulating layer 2 is made for example of silicon dioxide (SiO2) or silicon mononitride (SiN).

The insulating layer 2 has a recess-surface insulating region 21, an obverse-surface insulating region 22, and a rear-surface insulating region 24.

The recess-surface insulating region 21 is located on the element-receiving recess 14 of the substrate 1. In the present embodiment, the recess-surface insulating region 21 covers all of the recess lateral surfaces 141 and the recess bottom surface 142. The recess-surface insulating region 21 is formed by thermal oxidation, for example. The recess-surface insulating region 21 is made of $SiO_2$, for example.

At least a portion of the obverse-surface insulating region 22 is located on the obverse surface 111 of the substrate 1. The obverse-surface insulating region 22 is formed by thermal oxidation. The obverse-surface insulating region 22 is made of $SiO_2$, for example. In the present embodiment, the obverse-surface insulating region 22 covers the entire obverse surface 111.

At least a portion of the rear-surface insulating region 24 is located on the reverse surface 112 of the substrate 1. The rear-surface insulating region 24 is formed by thermal oxidation. The rear-surface insulating region 24 is made of $SiO_2$, for example. In the present embodiment, the rear-surface insulating region 24 covers the entire reverse surface 112.

The conductive layer 3 is electrically connected to the electronic element 71. The conductive layer 3 forms a conductive path through which of electrical current flows into and out of the electronic element 71. The conductive layer 3 is located on the obverse surface 111, the recess lateral surfaces 141, and the recess bottom surface 142.

The conductive layer 3 includes a seed layer and a plating layer.

The seed layer is an undercoat for forming a desired plating layer. The seed layer is sandwiched between the substrate 1 and the plating layer. The seed layer is made of copper (Cu), for example. The seed layer is deposited by sputtering to a thickness of, for example, 1 µm or less.

The plating layer is formed by electroplating using the seed layer. In one example, the plating layer is a stack of a Cu or titanium (Ti) layer, a nickel (Ni) layer, and a Cu layer. The plating layer has a thickness of about 3 to 10 µm, for example. The plating layer is thicker than the seed layer.

The conductive layer 3 has pad regions 33, obverse-surface contacting regions 381, and recess-surface contacting regions 382.

The pad regions 33 are located inside the element-receiving recess 14, typically on the recess bottom surface 142. The pad regions 33 located on the recess bottom surface 142 are used in mounting the electronic element 71 on the recess bottom surface 142.

The obverse-surface contacting regions 381 are supported on the obverse surface 111 and each have a portion layered on the obverse-surface insulating region 22 of the insulating layer 2.

The recess-surface contacting regions 382 are supported on the recess lateral surfaces 141 and each has a portion layered on the recess-surface insulating region 21 of the insulating layer 2.

The electronic element 71 is mounted on the recess bottom surface 142. One example of the electronic element 71 is an integrated circuit element. Other examples of the electronic element 71 include passive elements such as inductor and capacitor. In the present embodiment, the electronic element 71 protrudes beyond the obverse surface 111 in the thickness direction.

The sealing resin 6 fills the element-receiving recess 14 at least partially and covers the obverse surface 111 at least partially. In the present embodiment, the sealing resin 6 fully fills the element-receiving recess 14. In addition, the sealing resin 6 fully encapsulates the electronic element 71. In addition, the sealing resin 6 reaches the entire outer periphery of the obverse surface 111 as seen in the thickness direction, covering the obverse surface 111 substantially entirely.

The sealing resin 6 has a resin obverse surface 63 that faces in the same direction as the obverse surface 111. The sealing resin 6 has a plurality of through holes 64. The respective through holes 64 accommodate the columnar conductors 4.

Examples of a material of the sealing resin 6 include an epoxy resin, a phenolic resin, a polyimide resin, a polybenzoxazole (PBO) resin, and a silicone resin. Although the sealing resin 6 may be made of either a light transmitting resin or a non-light transmitting resin, a non-light transmitting resin is preferred in the present embodiment.

The respective columnar conductors 4 are electrically connected to the obverse-surface contacting region 381 of the conductive layer 3 and exposed from the sealing resin 6 at a side facing away from the obverse surface 111. In the present embodiment, the columnar conductors 4 are located directly on the obverse-surface contacting regions 381. The columnar conductors 4 are made of metal. Preferably, the columnar conductors 4 are made of Cu. The columnar conductors 4 are formed by plating. In the present embodiment, the columnar conductors 4 have a shape of a circular column. The columnar conductors 4 may be designed to have any height. In one example, the height of the columnar conductors 4 is from 50 to 440 µm.

The columnar conductors 4 have a conductor obverse surface 41. The conductor obverse surface 41 is exposed from the sealing resin 6 and faces in the same direction as the obverse surface 111. In the present embodiment, the conductor obverse surface 41 is flush with the resin obverse surface 63.

The electrode pads 51 are each disposed in contact with the conductor obverse surface 41 of the corresponding columnar conductor 4. The electrode pads 51 are electrically connected to the electronic element 71. The electrode pads 51 may be a stack of a Ni layer, a palladium (Pd) layer, and a gold (Au) layer in order from the one closer to the conductor obverse surface 41. In the present embodiment, the electrode pads 51 are rectangular. As seen in the thickness direction, each electrode pad 51 overlaps with the obverse-surface contacting region 381 at least partially and also with the resin obverse surface 63 at least partially. In the present embodiment, the electrode pad 51 encompasses the columnar conductor 4.

Next, a method for manufacturing the electronic device A1 will be described with reference to FIGS. 4 to 13.

Figure 4:
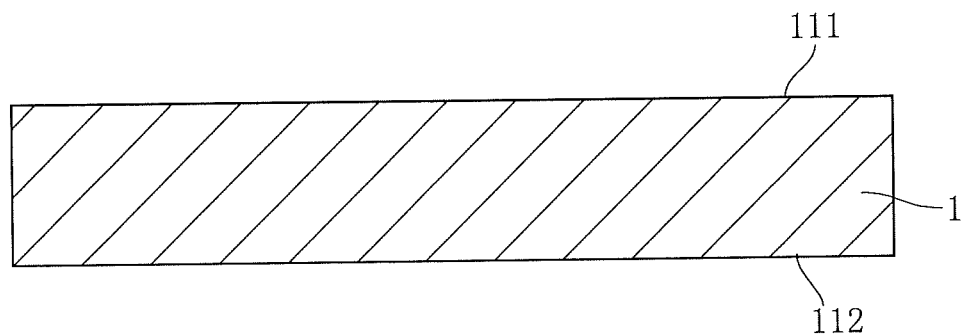
FIG. 4 is a cross-sectional view illustrating an example of a method for manufacturing the electronic device shown in FIG. 1.

First, a substrate 1 is prepared as shown in FIG. 4. The substrate 1 is made of a single-crystal semiconductor material. In the present embodiment, the substrate 1 is made of Si single crystal. The substrate 1 has a thickness of about 200 to 550 µm, for example. The substrate 1 prepared herein is of a size sufficient for a plurality of substrates 1 of the electronic device A1 described above. The manufacturing steps described below are of a method for collectively manufacturing a plurality of electronic devices A1. While a method for manufacturing one electronic device A1 is possible, a method for manufacturing a plurality of electronic devices A1 at once is practical in view of industrial efficiency. Although the substrate 1 shown in FIG. 4 is not precisely identical to the substrate 1 of the electronic device A1, both the substrates are generally referred to as the "substrate 1" for convenience.

The substrate 1 has an obverse surface 111 and a reverse surface 112 facing away from each other. In the present embodiment, the obverse surface 111 is a (100) surface, which is a surface having a crystal orientation of (100).

Next, the obverse surface 111 is oxidized to form a mask layer made of $SiO_2$. The mask layer has a thickness of about 0.7 to 1.0 µm, for example.

Next, the mask layer is patterned by for example etching. Through the patterning, an opening having for example a rectangular shape is formed in the mask layer. The shape and size of the opening is determined in accordance with the shape and size of an element-receiving recess 14 to be ultimately produced.

Figure 5:
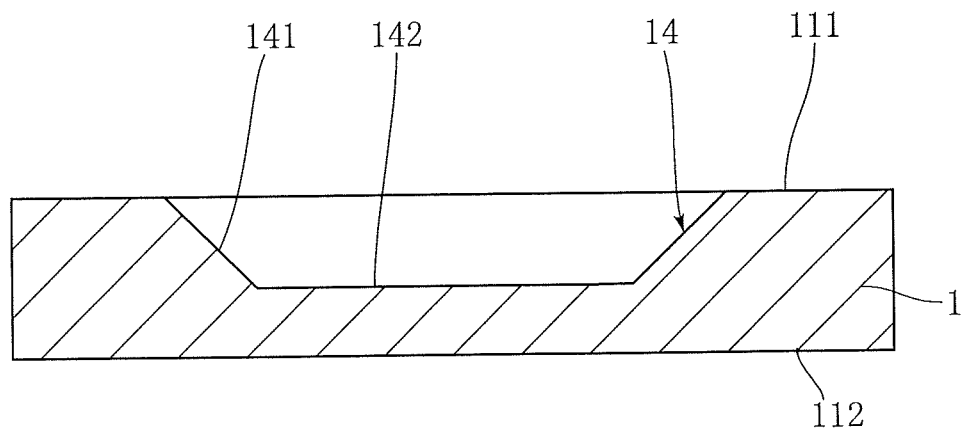
FIG. 5 is a cross-sectional view illustrating the example of the method for manufacturing the electronic device shown in FIG. 1.

Next, the substrate 1 is subjected to anisotropic etching using, for example, potassium hydroxide (KOH). KOH is an example of an alkaline etching solution appropriately usable for anisotropic etching of Si single crystal. Through the etching, a recess is formed in the substrate 1. The recess has a bottom surface and lateral surfaces. The bottom surface is at a right angle to the thickness direction. The lateral surfaces form an angle of about 55° with a plane perpendicular to the thickness direction. Through the etching, the element-receiving recess 14 shown in FIG. 5 is formed. The element-receiving recess 14 has recess lateral surfaces 141 and a recess bottom surface 142 that is recessed from the obverse surface 111. The element-receiving recess 14 is rectangular as seen in the thickness direction.

Figure 6:
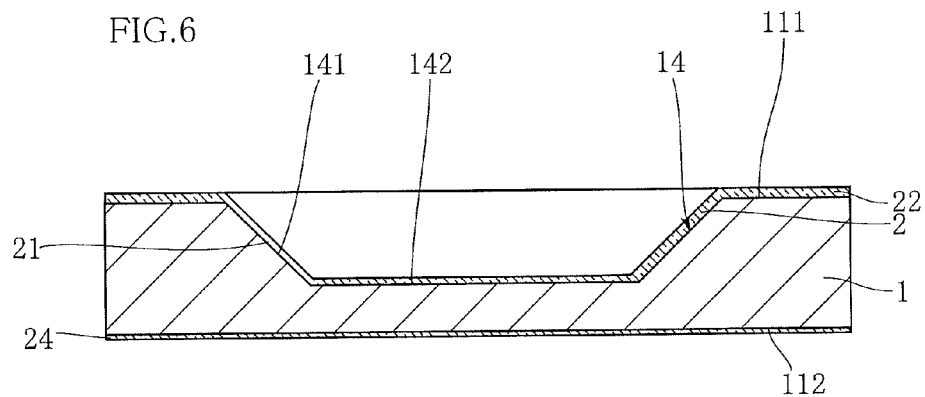
FIG. 6 is a cross-sectional view illustrating the example of the method for manufacturing the electronic device shown in FIG. 1.

Next, as shown in FIG. 6, thermal oxidation is performed to form an insulating layer 2 on the obverse surface 111, the recess lateral surfaces 141, the recess bottom surface 142, and the reverse surface 112. The recess-surface insulating region 21, the obverse-surface insulating region 22, and the rear-surface insulating region 24 described above are part of the insulating layer 2.

Figure 7:
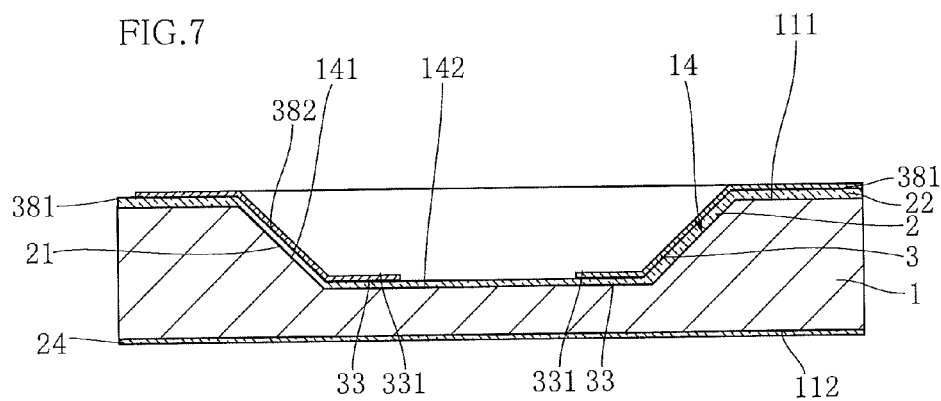
FIG. 7 is a cross-sectional view illustrating the example of the method for manufacturing the electronic device shown in FIG. 1.

Next, a seed layer and a plating layer are formed in order to form a conductive layer 3 as shown in FIG. 7. The seed layer is formed by patterning a layer deposited by for example Cu sputtering. The plating layer is formed by electroplating using the seed layer. As a result, a stack of, for example, a Cu or Ti layer, a Ni layer, and a Cu layer is formed as the plating layer. The seed layer and the plating layer are layered to form a conductive layer 3. The conductive layer 3 thus formed has pad regions 33, obverse-surface contacting regions 381, and recess-surface contacting regions 382.

Figure 8:
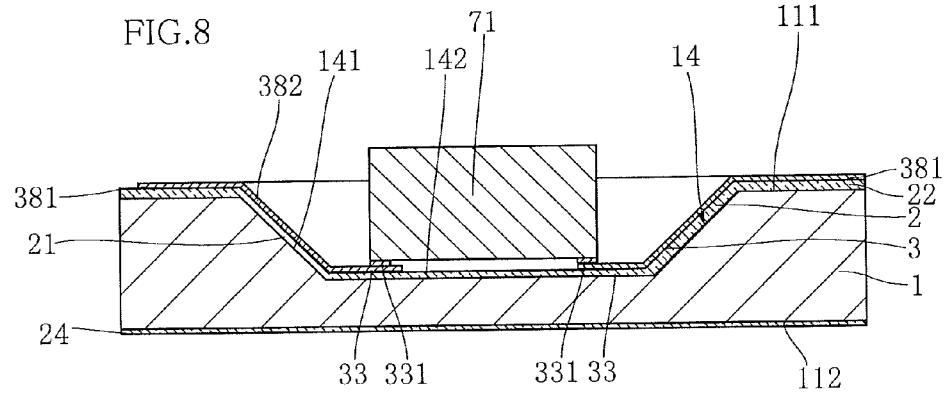
FIG. 8 is a cross-sectional view illustrating the example of the method for manufacturing the electronic device shown in FIG. 1.

Next, an electronic element 71 is mounted in the element-receiving recess 14 as shown in FIG. 8. Specifically, the electronic element 71 is mounted on the recess bottom surface 142. The electronic element 71 is provided, for example, with solder balls in advance. The solder balls are coated with flux. With the aid of the flux, which is viscous, the electronic element 71 is placed on the pad regions 33. The solder balls are melted in a reflow furnace and then hardened. This completes the mounting of the electronic element 71. Instead of solder balls, solder paste may be applied to the pad regions 33 of the conductive layer 3. The electronic element 71 thus mounted has a portion protruding beyond the obverse surface 111.

Figure 9:
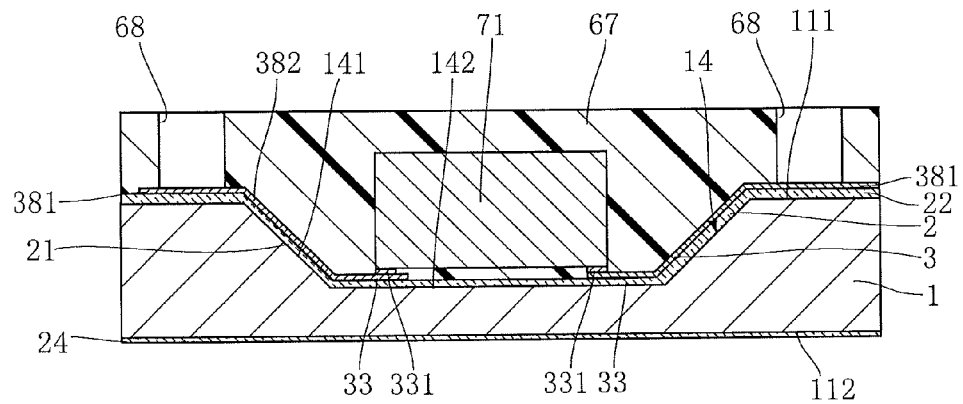
FIG. 9 is a cross-sectional view illustrating the example of the method for manufacturing the electronic device shown in FIG. 1.

Next, a resist layer 67 is formed as shown in FIG. 9. The resist layer 67 is formed from a resist resin material that is highly permeable and capable of being patterned by exposure to light. The resist resin material is supplied to fill the element-receiving recess 14 and subsequently to cover the electronic element 71 sufficiently. Then, the resist resin material is patterned by exposure to light so as to form a plurality of through holes 68. The respective through holes 68 reach the obverse-surface contacting regions 381. In the present embodiment, the through holes 68 have a shape of a circular column. In addition, the through holes 68 have a depth of 50 to 440 µm, for example.

Figure 10:
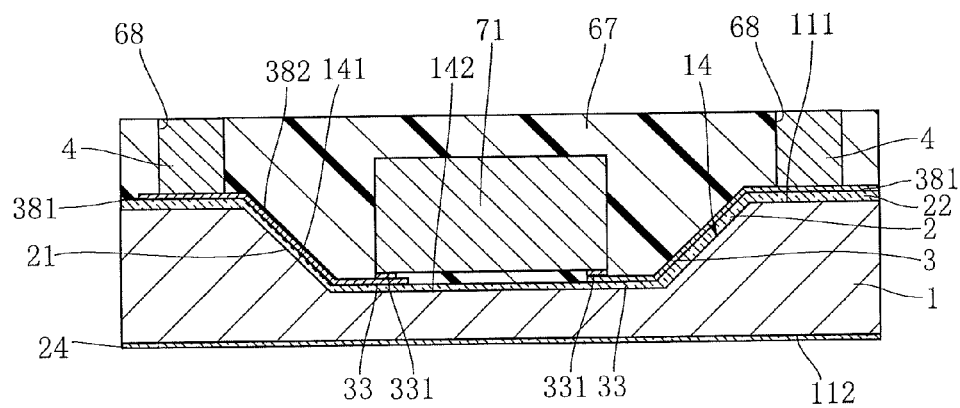
FIG. 10 is a cross-sectional view illustrating the example of the method for manufacturing the electronic device shown in FIG. 1.

Next, a plurality of columnar conductors 4 are formed as shown in FIG. 10. The plurality of columnar conductors 4 are formed by filling the through holes 68 with metal such as Cu, by electroplating using the exposed portions of the obverse-surface contacting regions 381 through the through holes 68.

Figure 11:
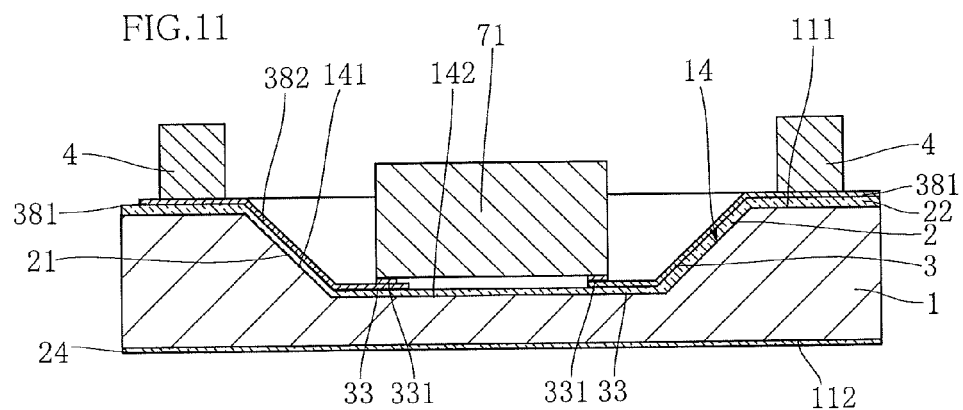
FIG. 11 is a cross-sectional view illustrating the example of the method for manufacturing the electronic device shown in FIG. 1.

Next, the resist layer 67 is removed as shown in FIG. 11, leaving the plurality of columnar conductors 4 upright on the obverse surface 111.

Figure 12:
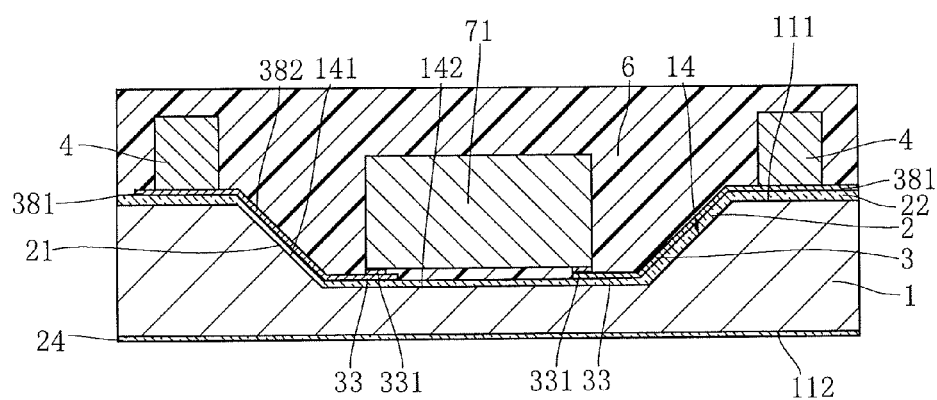
FIG. 12 is a cross-sectional view illustrating the example of the method for manufacturing the electronic device shown in FIG. 1.
Figure 13:
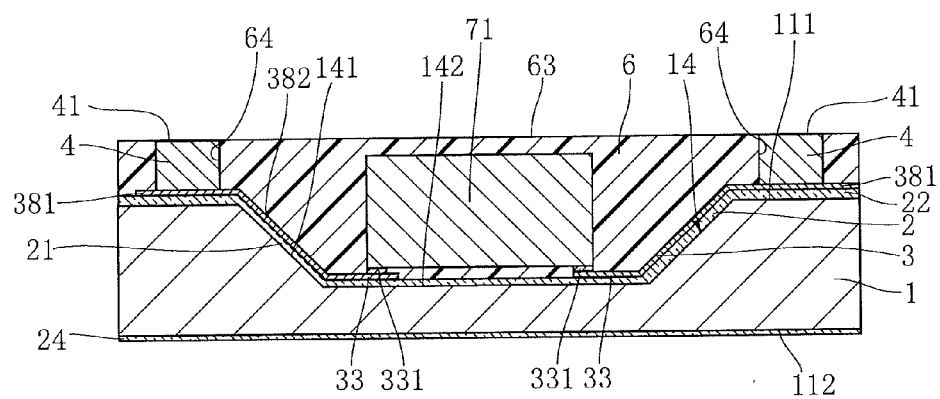
FIG. 13 is a cross-sectional view illustrating the example of the method for manufacturing the electronic device shown in FIG. 1.

Next, a sealing resin 6 is formed as shown in FIG. 12. The sealing resin 6 is formed from a highly-permeable and photocurable resin material. The resin material is supplied to fill the element-receiving recess 14 and subsequently to cover the electronic element 71 completely. The resin material is then cured to form the sealing resin 6.

Next, the sealing resin 6 in the state shown in FIG. 12 is ground to remove an upper portion such that each columnar conductor 4 is partially exposed. Specifically, the upper portion of the sealing resin 6 shown in FIG. 12 is removed together with the upper portions of the columnar conductors 4 shown in FIG. 12. This defines a resin obverse surface 63 of the sealing resin 6 and a conductor obverse surface 41 of each columnar conductor 4. The resin obverse surface 63 and the conductor obverse surfaces 41 are flush with each other. Since the sealing resin 6 before the grinding fully covered the columnar conductors 4, the sealing resin 6 after the grinding is provided with the plurality of through holes 64 each of which accommodates the corresponding columnar conductor 4.

Subsequently, electrode pads 51 are formed. The electrode pads 51 are formed by electroless plating with metal such as Ni, Pd, or Au.

The substrate 1 is then cut with, for example, a dicer into individual electronic devices A1 as shown in FIG. 1-3.

The following describes operation of the electronic device A1.

According to the present embodiment, the sealing resin 6 and the columnar conductors 4 protrude beyond the obverse surface 111 of the substrate 1. From the standpoint of protection of the electronic element 71 and manufacturing convenience, the element-receiving recess 14 is often associated with restrictions on the dimensions such as a depth. In addition, there are various user's requests as to the overall size of the electronic device A1 (especially, dimensions in terms of the thickness direction) regardless of the size of the electronic element 71. The thickness dimensions of the sealing resin 6 and the columnar conductors 4 can be altered in view of the requests, allowing the thickness dimensions of the overall electronic device A1 to be determined more flexibly without a change to the size of the element-receiving recess 14 and/or the arrangement of the electronic element 71.

In the process of collectively manufacturing a plurality of electronic devices A1, the sealing resin 6 initially formed has a larger surface area than in the process of manufacturing one electronic device A1. Portions of the sealing resin 6 are received within the plurality of element-receiving recesses 14. This is effective to resist a force tending to displace the sealing resin 6 from the substrate 1. In addition, this resisting force may be produced by the substrate 1, preventing the generation of unnecessary stress to solder 331 bonding the electronic element 71. The individual electronic devices A1 are also capable of preventing displacement or detachment of the sealing resin 6 from the substrate 1.

The conductor obverse surface 41 of the columnar conductor 4 being flush with the resin obverse surface 63 of the sealing resin 6 facilitates appropriate production of the electrode pads 51.

With the electronic element 71 protruding beyond the obverse surface 111, the electronic element 71 has a portion located in a protruding portion of the sealing resin 6 beyond the obverse surface 111. This configuration may serve to improve the bonding strength between the substrate 1, the electronic element 71, and the sealing resin 6.

In the present embodiment, the recess lateral surfaces 141 are inclined relative to the thickness direction. This configuration facilitates the recess lateral surfaces 141 to be formed relatively flat. This allows for greater ease in forming the seed layer (i.e., the conductive layer 3).

Figure 14:
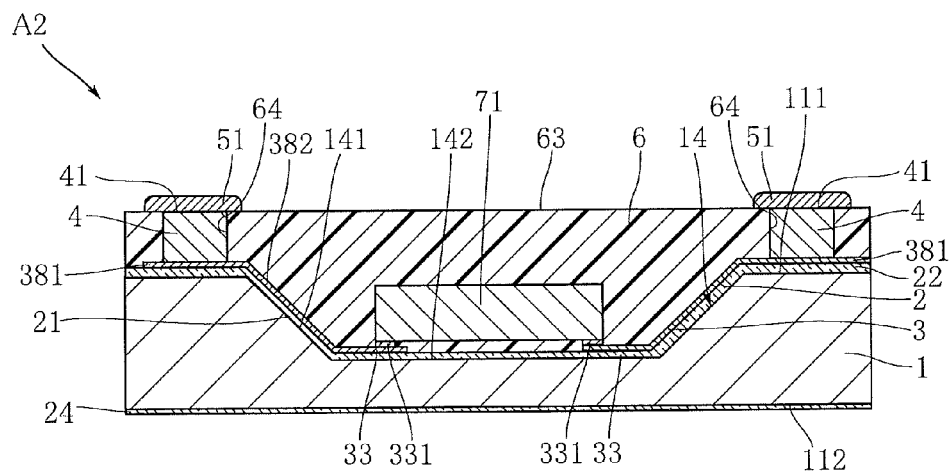
FIG. 14 is a cross-sectional view of an electronic device according to a second embodiment of the present invention.
Figure 15:
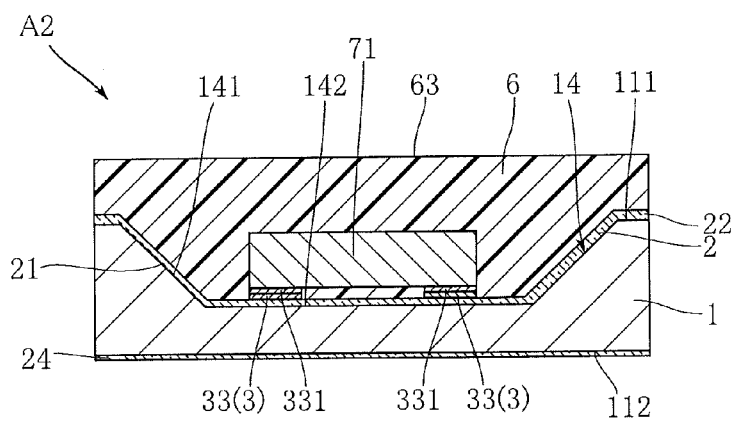
FIG. 15 is a cross-sectional view of the electronic device shown in FIG. 14.

FIGS. 14 and 15 show an electronic device according to a second embodiment of the present invention. The electronic device A2 according to the present embodiment includes a substrate 1, an insulating layer 2, a conductive layer 3, a plurality of columnar conductors 4, a plurality of electrode pads 51, a sealing resin 6, and an electronic element 71.

The substrate 1 is made of a single-crystal semiconductor material. In the present embodiment, the substrate 1 is made of single-crystal Si. However, the material of the substrate 1 is not limited to Si and may for example be SiC. The substrate 1 has a thickness of about 200 to 550 µm, for example. The electronic element 71 is mounted on the substrate 1.

The substrate 1 has an obverse surface 111 and a reverse surface 112.

The obverse surface 111 faces one side in the thickness direction. The obverse surface 111 is flat and perpendicular to the thickness direction. The obverse surface 111 is either a (100) surface or a (110) surface. In the present embodiment, the obverse surface 111 is a (100) surface. In the present embodiment, the obverse surface 111 has a shape of a rectangular ring.

The reverse surface 112 faces the opposite side in the thickness direction. In other words, the reverse surface 112 faces away from the obverse surface 111. The reverse surface 112 is flat and perpendicular to the thickness direction.

The substrate 1 has an element-receiving recess 14.

The element-receiving recess 14 is recessed from the obverse surface 111. The electronic element 71 is disposed within the element-receiving recess 14. The element-receiving recess 14 has a depth (a separation distance in the thickness direction between the obverse surface 111 and a recess bottom surface 142, which will be described later) of about 100 to 300 µm, for example. The element-receiving recess 14 is rectangular as seen in the thickness direction. This shape of the element-receiving recess 14 is determined by the obverse surface 111 being a (100) surface.

The element-receiving recess 14 has recess lateral surfaces 141 and the recess bottom surface 142.

The recess bottom surface 142 and the obverse surface 111 face the same side in the thickness direction. The recess bottom surface 142 is rectangular as seen in the thickness direction. The electronic element 71 is disposed on the recess bottom surface 142. The recess bottom surface 142 is perpendicular to the thickness direction.

The recess lateral surfaces 141 upstand from the recess bottom surface 142. The recess lateral surfaces 141 are continuous with the recess bottom surface 142. The recess lateral surfaces 141 are inclined relative to the thickness direction. Each recess lateral surface 141 forms an angle of 55° with a plane perpendicular to the thickness direction. This angle results from the obverse surface 111 being a (100) surface. The element-receiving recess 14 has four recess lateral surfaces 141 each of which is a flat surface. The recess lateral surfaces 141 are continuous with the obverse surface 111.

The insulating layer 2 is sandwiched between the conductive layer 3 and the substrate 1. The insulating layer 2 has a thickness of about 0.1 to 1.0 µm, for example. The insulating layer 2 is made for example of $SiO_2$ or SiN.

The insulating layer 2 has a recess-surface insulating region 21, an obverse-surface insulating region 22, and a rear-surface insulating region 24.

The recess-surface insulating region 21 is located on the element-receiving recess 14 of the substrate 1. In the present embodiment, the recess-surface insulating region 21 covers all of the recess lateral surfaces 141 and the recess bottom surface 142. The recess-surface insulating region 21 is formed by thermal oxidation, for example. The recess-surface insulating region 21 is made of $SiO_2$, for example.

At least a portion of the obverse-surface insulating region 22 is located on the obverse surface 111 of the substrate 1. The obverse-surface insulating region 22 is formed by thermal oxidation. The obverse-surface insulating region 22 is made of $SiO_2$, for example. In the present embodiment, the obverse-surface insulating region 22 covers the entire obverse surface 111.

At least a portion of the rear-surface insulating region 24 is located on the reverse surface 112 of the substrate 1. The rear-surface insulating region 24 is formed by thermal oxidation. The rear-surface insulating region 24 is made of $SiO_2$, for example. In the present embodiment, the rear-surface insulating region 24 covers the entire reverse surface 112.

The conductive layer 3 is electrically connected to the electronic element 71. The conductive layer 3 forms a conductive path through which of electrical current flows into and out of the electronic element 71. The conductive layer 3 is located on the obverse surface 111, the recess lateral surfaces 141, and the recess bottom surface 142.

The conductive layer 3 includes a seed layer and a plating layer.

The seed layer is an undercoat for forming a desired plating layer. The seed layer is sandwiched between the substrate 1 and the plating layer. The seed layer is made of copper, for example. The seed layer is deposited by sputtering to a thickness of, for example, 1 µm or less.

The plating layer is formed by electroplating using the seed layer. In one example, the plating layer is a stack of a Cu or Ti layer, a Ni layer, and a Cu layer. The plating layer has a thickness of about 3 to 10 µm, for example. The plating layer is thicker than the seed layer.

The conductive layer 3 has pad regions 33, obverse-surface contacting regions 381, and recess-surface contacting regions 382.

The pad regions 33 are located inside the element-receiving recess 14, typically on the recess bottom surface 142. The pad regions 33 located on the recess bottom surface 142 are used in mounting the electronic element 71 on the recess bottom surface 142.

The obverse-surface contacting regions 381 are supported on the obverse surface 111 and each have a portion layered on the obverse-surface insulating region 22 of the insulating layer 2.

The recess-surface contacting regions 382 are supported on the recess lateral surfaces 141 and each has a portion layered on the recess-surface insulating region 21 of the insulating layer 2.

The electronic element 71 is mounted on the recess bottom surface 142. One example of the electronic element is an integrated circuit element. Other examples of the electronic element 71 include passive elements such as inductor and capacitor. In the present embodiment, the electronic element 71 does not protrude beyond the obverse surface 111 in the thickness direction and the entire electronic element 71 is accommodated completely within the element-receiving recess 14.

The sealing resin 6 fills the element-receiving recess 14 at least partially and covers the obverse surface 111 at least partially. In the present embodiment, the sealing resin 6 fully fills the element-receiving recess 14. In addition, the sealing resin 6 fully encapsulates the electronic element 71. In addition, the sealing resin 6 reaches the entire outer periphery of the obverse surface 111 as seen in the thickness direction, covering the obverse surface 111 substantially entirely.

The sealing resin 6 has a resin obverse surface 63 that faces in the same direction as the obverse surface 111. The sealing resin 6 has a plurality of through holes 64. The respective through holes 64 accommodate the columnar conductors 4.

Examples of a material of the sealing resin 6 include an epoxy resin, a phenolic resin, a polyimide resin, a PBO resin, and a silicone resin. Although the sealing resin 6 may be made of either a light transmitting resin or a non-light transmitting resin, a non-light transmitting resin is preferred in the present embodiment.

The respective columnar conductors 4 are electrically connected to the obverse-surface contacting region 381 of the conductive layer 3 and exposed from the sealing resin 6 at a side facing away from the obverse surface 111. In the present embodiment, the columnar conductors 4 are located directly on the obverse-surface contacting regions 381. The columnar conductors 4 are made of metal. Preferably, the columnar conductors 4 are made of Cu. The columnar conductors 4 are formed by plating. In the present embodiment, the columnar conductors 4 have a shape of a circular column. The columnar conductors 4 may be designed to have any height. In one example, the height of the columnar conductors 4 is from 50 to 440 µm. The columnar conductors 4 have a conductor obverse surface 41. The conductor obverse surface 41 is exposed from the sealing resin 6 and faces in the same direction as the obverse surface 111. In the present embodiment, the conductor obverse surface 41 is flush with the resin obverse surface 63.

The electrode pads 51 are each disposed in contact with the conductor obverse surface 41 of the corresponding columnar conductor 4. The electrode pads 51 are electrically connected to the electronic element 71. The electrode pads 51 may be a stack of a Ni layer, a Pd layer, and a Au layer in order from the one closer to the conductor obverse surface 41. In the present embodiment, the electrode pads 51 are rectangular. As seen in the thickness direction, each electrode pad 51 overlaps with the obverse-surface contacting region 381 at least partially and also with the resin obverse surface 63 at least partially. In the present embodiment, the electrode pad 51 completely covers the columnar conductor 4.

The following describes operation of the electronic device A2.

According to the present embodiment, the sealing resin 6 and the columnar conductors 4 protrude beyond the obverse surface 111 of the substrate 1. From the standpoint of protection of the electronic element 71 and manufacturing convenience, the element-receiving recess 14 is often associated with restrictions on the dimensions such as a depth. In addition, there are various user's requests as to the overall size of the electronic device A2 (especially, dimensions in terms of the thickness direction) regardless of the size of the electronic element 71. The thickness dimensions of the sealing resin 6 and the columnar conductors 4 can be altered in view of the requests, allowing the thickness dimensions of the overall electronic device A2 to be determined more flexibly without a change to the size of the element-receiving recess 14 and/or the arrangement of the electronic element 71.

In the process of collectively manufacturing a plurality of electronic devices A2, the sealing resin 6 initially formed has a larger surface area than in the process of manufacturing one electronic device A2. Portions of the sealing resin 6 are received within the plurality of element-receiving recesses 14. This is effective to resist a force tending to displace the sealing resin 6 from the substrate 1. In addition, this resisting force may be produced by the substrate 1, preventing the generation of unnecessary stress to solder 331 bonding the electronic element 71. The individual electronic devices A2 are also capable of preventing displacement or detachment of the sealing resin 6 from the substrate 1.

The conductor obverse surface 41 of the columnar conductor 4 being flush with the resin obverse surface 63 of the sealing resin 6 facilitates appropriate production of the electrode pads 51.

In the present embodiment, the recess lateral surfaces 141 are inclined relative to the thickness direction. This configuration facilitates the recess lateral surfaces 141 to be formed relatively flat. This allows for greater ease in forming the seed layer (i.e., the conductive layer 3).

Electronic devices according to the present invention are not limited to the specific embodiments described above. For electronic devices according to the present invention, various changes and alterations may be made to specific configuration of component elements.

The invention claimed is:

1. An electronic device, comprising: a substrate made of a semiconductor material and having a substrate obverse surface and a substrate reverse surface that are opposite to each other in a thickness direction of the substrate; an electronic element mounted on the substrate; a conductive layer electrically connected to the electronic element; a sealing resin; and a columnar conductor, wherein the substrate is formed with an element-receiving recess recessed from the substrate obverse surface and having a recess bottom surface, the electronic element is mounted on the recess bottom surface, the conductive layer has an obverse-surface contacting region located on the substrate obverse surface, the sealing resin is disposed in at least a part of the element-receiving recess and covers at least a part of the substrate obverse surface, the columnar conductor is electrically connected to the obverse-surface contacting region of the conductive layer and exposed from the sealing resin at a side opposite to the substrate obverse surface, and an obverse surface of the electronic element is spaced further from the recess bottom surface in the thickness direction than an obverse surface of the obverse-surface contacting region of the conductive layer, wherein the columnar conductor has a side surface that is parallel to the thickness direction and covered with the sealing resin; and an electrode pad that is in contact with the columnar conductor at a side of the columnar conductor that is opposite to a side facing the substrate obverse surface, wherein the columnar conductor and the electrode pad are made of mutually different electroconductive materials.

2. The electronic device according to claim 1, wherein the columnar conductor has a conductor obverse surface that is exposed from the sealing resin and faces in a same direction as the substrate obverse surface.

3. The electronic device according to claim 2, wherein the sealing resin has a resin obverse surface facing in the same direction as the substrate obverse surface, and
the conductor obverse surface is flush with the resin obverse surface.

4. The electronic device according to claim 3, wherein an entirety of the element-receiving recess is filled with the sealing resin.

5. The electronic device according to claim 4, wherein the sealing resin reaches an entire periphery of the substrate obverse surface as seen in the thickness direction.

6. The electronic device according to claim 1, wherein the columnar conductor is made of a metal.

7. The electronic device according to claim 6, wherein the columnar conductor is made of Cu.

8. The electronic device according to claim 6, wherein the columnar conductor is formed by plating.

9. The electronic device according to claim 1, further comprising an electrode pad that is in contact with the columnar conductor at a side opposite to the substrate obverse surface.

10. The electronic device according to claim 9, wherein the electrode pad overlaps with at least a part of each of the columnar conductor and the sealing resin as seen in the thickness direction.

11. The electronic device according to claim 10, wherein the electrode pad encompasses the columnar conductor as seen in the thickness direction.

12. The electronic device according to claim 1, wherein the sealing resin encapsulates the electronic element.

13. The electronic device according to claim 1, wherein the conductive layer has a pad region that is located on the recess bottom surface and used for mounting the electronic element.

14. The electronic device according to claim 13, wherein the element-receiving recess has a recess lateral surface extending upwards from the recess bottom surface.

15. The electronic device according to claim 14, wherein the conductive layer has a recess-surface contacting region located on the recess lateral surface.

16. The electronic device according to claim 15, wherein the recess lateral surface is continuous with the recess bottom surface.

17. The electronic device according to claim 16, wherein the recess lateral surface is continuous with the substrate obverse surface.

18. The electronic device according to claim 17, wherein the recess-surface contacting region is continuous with the obverse-surface contacting region.

19. The electronic device according to claim 13, wherein the substrate is made of a single-crystal semiconductor material.

20. The electronic device according to claim 19, wherein the semiconductor material is Si.

21. The electronic device according to claim 20, wherein the substrate obverse surface and the substrate reverse surface are each flat and perpendicular to the thickness direction.

22. The electronic device according to claim 21, wherein the substrate obverse surface is a (100) surface.

23. The electronic device according to claim 22, wherein the recess lateral surface forms an angle of 55° with the recess bottom surface.

* * * * *